US008551799B2

(12) United States Patent
Shaw et al.

(10) Patent No.: US 8,551,799 B2
(45) Date of Patent: Oct. 8, 2013

(54) ENCAPSULATED MICRO-ELECTRO-MECHANICAL DEVICE, IN PARTICULAR A MEMS ACOUSTIC TRANSDUCER

(75) Inventors: Mark Andrew Shaw, Milan (IT); Gianmarco Antonio Camillo, Trezzano Rosa (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 266 days.

(21) Appl. No.: 13/102,831

(22) Filed: May 6, 2011

(65) Prior Publication Data

US 2011/0274299 A1 Nov. 10, 2011

(30) Foreign Application Priority Data

May 6, 2010 (IT) .............. T02010A0380

(51) Int. Cl.
- H01L 21/00 (2006.01)
- H01L 29/84 (2006.01)
- H01L 23/06 (2006.01)
- H01L 23/04 (2006.01)

(52) U.S. Cl.
USPC ............... 438/50; 438/51; 438/127; 257/416; 257/684; 257/730

(58) Field of Classification Search
None
See application file for complete search history.

(56) References Cited

U.S. PATENT DOCUMENTS

| 6,555,904 | B1 | 4/2003 | Karpman |
| 6,781,231 | B2 | 8/2004 | Minervini |
| 7,166,910 | B2 | 1/2007 | Minervini |
| 2002/0146200 | A1 | 10/2002 | Kudrle et al. |
| 2005/0018864 | A1 | 1/2005 | Minervini |
| 2007/0041597 | A1 | 2/2007 | Song |
| 2007/0071268 | A1 | 3/2007 | Harney et al. |
| 2007/0202627 | A1 | 8/2007 | Minervini |
| 2007/0205492 | A1 | 9/2007 | Wang |
| 2008/0150104 | A1 | 6/2008 | Zimmerman et al. |
| 2009/0001553 | A1 | 1/2009 | Pahl et al. |

FOREIGN PATENT DOCUMENTS

WO 2006/085825 A1 8/2006

OTHER PUBLICATIONS

Burton, P., "Joining of Two Technologies: Wire Mesh & Plastic to Produce Shielded Plastic Enclosures," Proceedings of the IEEE 1999 International Symposium on EMC, Seattle, USA, Aug. 2-6, 1999, pp. 586-589.

Gale, B. et al., "MEMS Packaging," Microsystems Principles, ENGR 494C and 594C, Oct. 11, 2001.

(Continued)

*Primary Examiner* — Scott B Geyer
(74) *Attorney, Agent, or Firm* — Seed IP Law Group PLLC

(57) ABSTRACT

An encapsulated micro-electro-mechanical device, wherein a MEMS chip is encapsulated by a package formed by a first, a second, and a third substrates that are bonded together. The first substrate has a main surface bearing the MEMS chip, the second substrate is bonded to the first substrate and defines a chamber surrounding the MEMS chip, and the third substrate is bonded to the second substrate and upwardly closes the chamber. A grid or mesh structure of electrically conductive material is formed in or on the third substrate and overlies the MEMS chip; the second substrate has a conductive connection structure coating the walls of the chamber, and the first substrate incorporates an electrically conductive region, which forms, together with the conductive layer and the grid or mesh structure, a Faraday cage.

26 Claims, 12 Drawing Sheets

(56) References Cited

OTHER PUBLICATIONS

Premachandran, C.S. et al., "Si-based Microphone Testing Methodology and Noise reduction," Part of the Symposium on Design, Test, Integration, and Packaging of MEMS/MOEMS, Proceedings of SPIE 4019:588-592, 2000.

Sarto, M. S. et al., "Electromagnetic Performance of Innovative Lightweight Shields to Reduce Radiated Emissions From PCBs," IEEE Transactions on Electromagnetic Compatibility 44(2):353-363, May 2002.

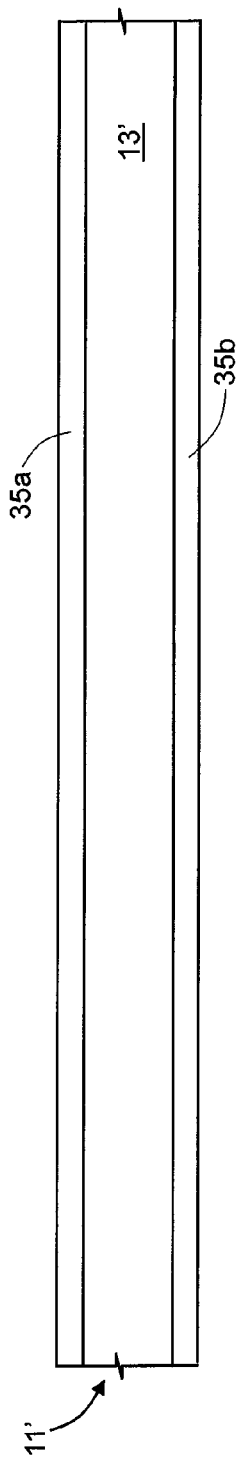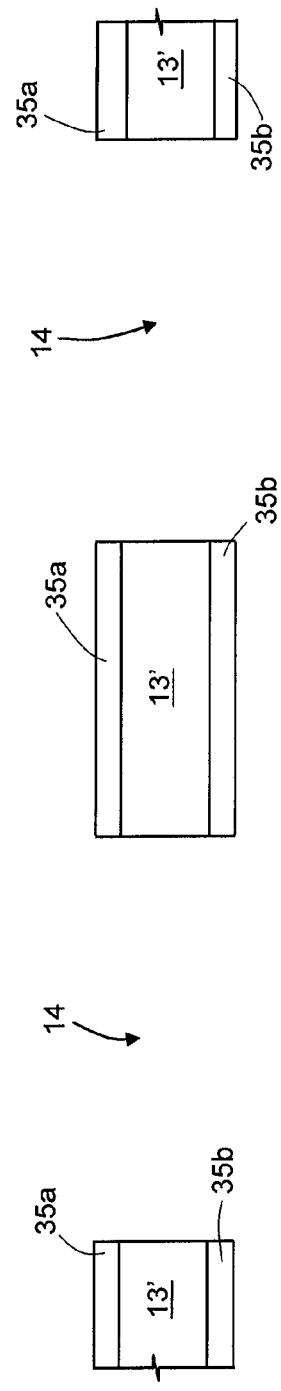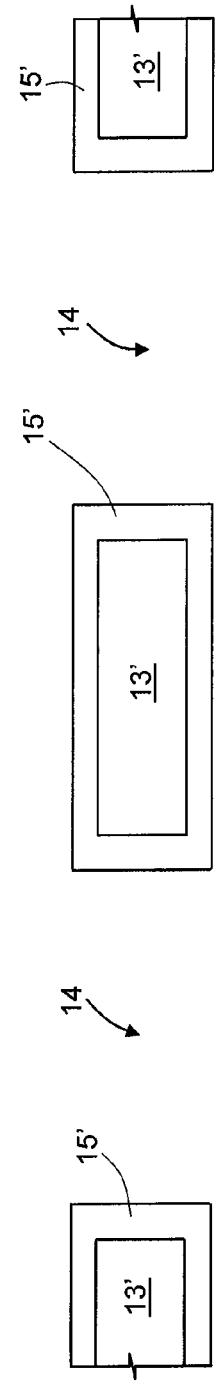

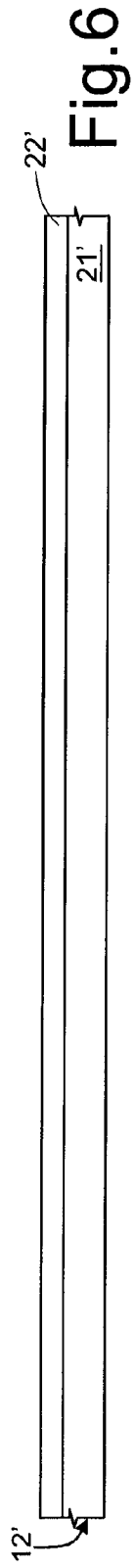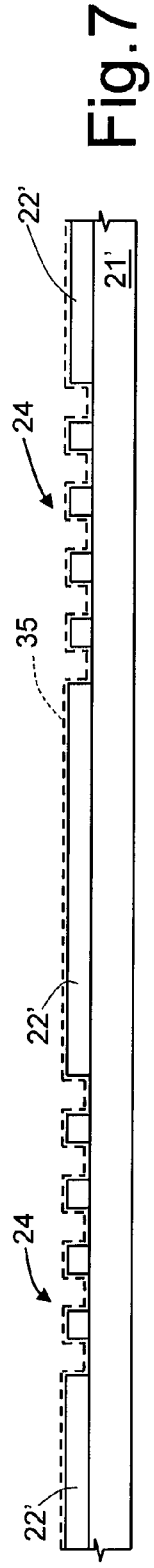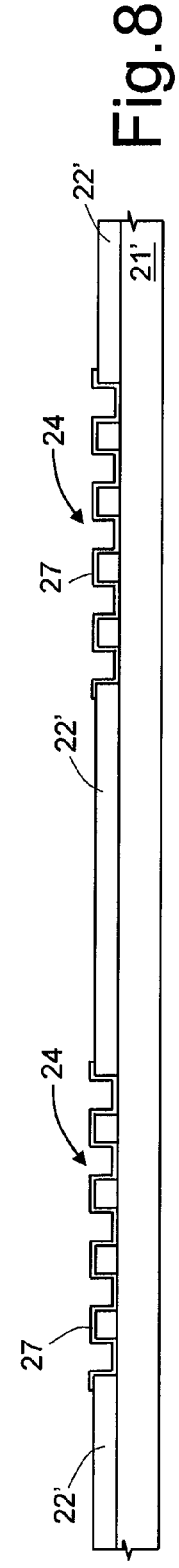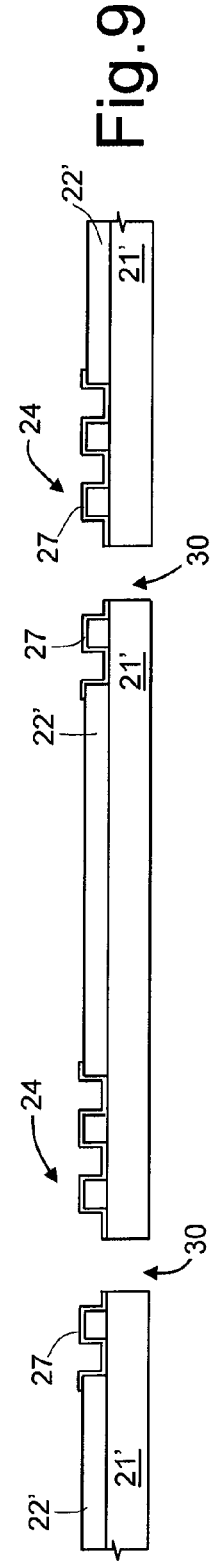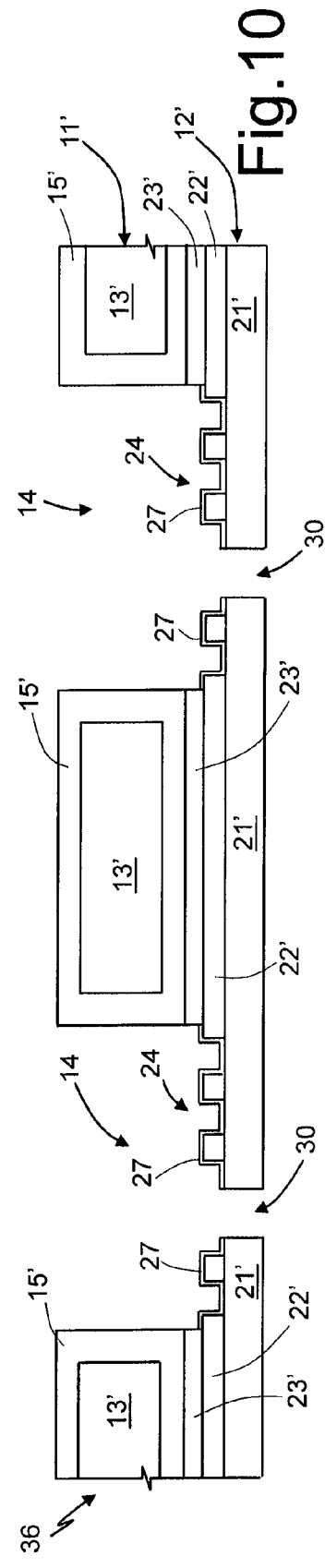

ENCAPSULATED MICRO-ELECTRO-MECHANICAL DEVICE, IN PARTICULAR A MEMS ACOUSTIC TRANSDUCER

BACKGROUND

1. Technical Field

The present disclosure regards an encapsulated micro-electro-mechanical device, in particular a MEMS acoustic transducer, such as a microphone.

2. Description of the Related Art

As is known, microphones built in MEMS (micro-electro-mechanical system) technology generally comprise a first chip integrating a pressure sensor and a second chip integrating an electronic circuit for processing electrical signals (read circuit). The two chips may be mounted on a support and encapsulated in a package that mechanically protects the chips, above all the microphone, which is in itself fragile and very subject to damage. Furthermore, the package may have metal structures forming Faraday cages for eliminating electromagnetic interference.

Various types of package forming Faraday cages are known for integrated circuits. For example, in some solutions, the package is formed by a base, on which a support for the chips is bonded, and by a cap soldered to the base. For example, the cap may have a metal coating, and the base may be made of metal, being for instance formed by the lead frame for electrically connecting chips (e.g., see "MEMS Packaging", Bruce K. Gale et al., Oct. 11, 2001, http://www.mech.utah.edu/~gale/mems/Lecture%2016b%20MEMS%20 Packaging.pdf; and "Si-based Microphone Testing Methodology and Noise reduction", C. S. Premachandran et al., Symposium on Design, Test, Integration, and Packaging of MEMS/MOEMS, Proceedings of SPIE Vol. 4019 (2000))•0277-786X/OOI). Alternatively, the base may comprise metal layers, for example alternating with insulating materials (see, for example, US 2007/071268; U.S. Pat. No. 6,781,231; U.S. Pat. No. 7,166,910; EP 1 755 360; U.S. Pat. No. 7,434,305; US 2004/046 245; U.S. Pat. No. 7,436,054; U.S. Pat. No. 7,381,589; and WO2007/054070).

However, known solutions are either complex or costly, and thus leave room for improvement. In particular, in certain solutions it is problematical to apply the metal coating via usual sputtering operations on account of the depth of the structures in the cap. Furthermore, in all cases, the process is costly and far from suited to devices, such as microphones, that are to be used in cell phones and the like, the costs of which should be as low as possible.

BRIEF SUMMARY

One embodiment of the present disclosure is an encapsulated micro-electro-mechanical device that overcomes the drawbacks of the known art.

One embodiment is an encapsulated micro-electromechanical device that includes a MEMS chip and a package formed by first, second, and third substrates bonded to each other. The first substrate has an electrically conducting region and a main surface carrying the MEMS chip. The second substrate is bonded to the first substrate, defines a chamber surrounding the MEMS chip, and has a conductive connection structure extending transversely between the first and the third substrates. The third substrate is bonded to the second substrate, upwardly defines the chamber, and has a grid or mesh structure of electrically conductive material overlying the MEMS chip. The electrically conducting region, the conductive connection structure, and the grid or mesh structure are electrically coupled to each other and form a Faraday cage.

One embodiment is a process for manufacturing a micro-electro-mechanic device. The process includes:

bonding a MEMS chip onto a first substrate incorporating an electrically conducting region;

forming a chamber in a second substrate;

forming a conductive connection structure transversely to the second substrate;

forming a grid or mesh structure of electrically conductive material on a third substrate;

bonding the third substrate to the second substrate so that the grid or mesh structure extends on the chamber; and bonding the second substrate to the first substrate so that the chamber surrounds the MEMS chip, the chamber is enclosed between the third and the first substrates, and the electrically conducting region is electrically coupled to the conductive connection structure and to the grid or mesh structure, forming a Faraday cage.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIGS. 3-12 show cross-sections of intermediate structures obtained during the manufacture of the transducer of FIG. 1, in successive manufacturing steps of the manufacturing process;

DETAILED DESCRIPTION

Figure 1:
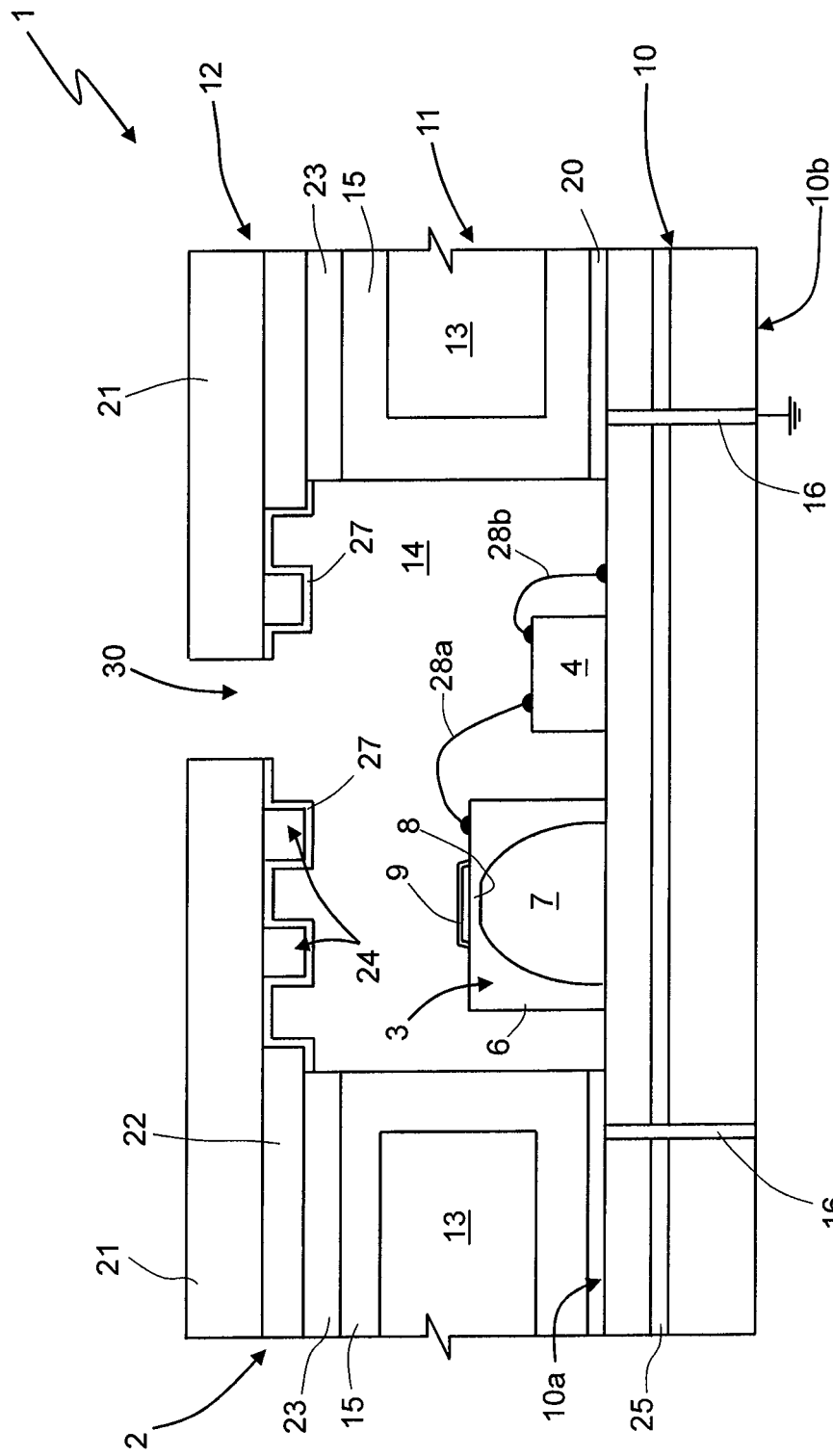
FIG. 1 shows a cross-section of an embodiment of the present MEMS acoustic transducer.
Figure 2:
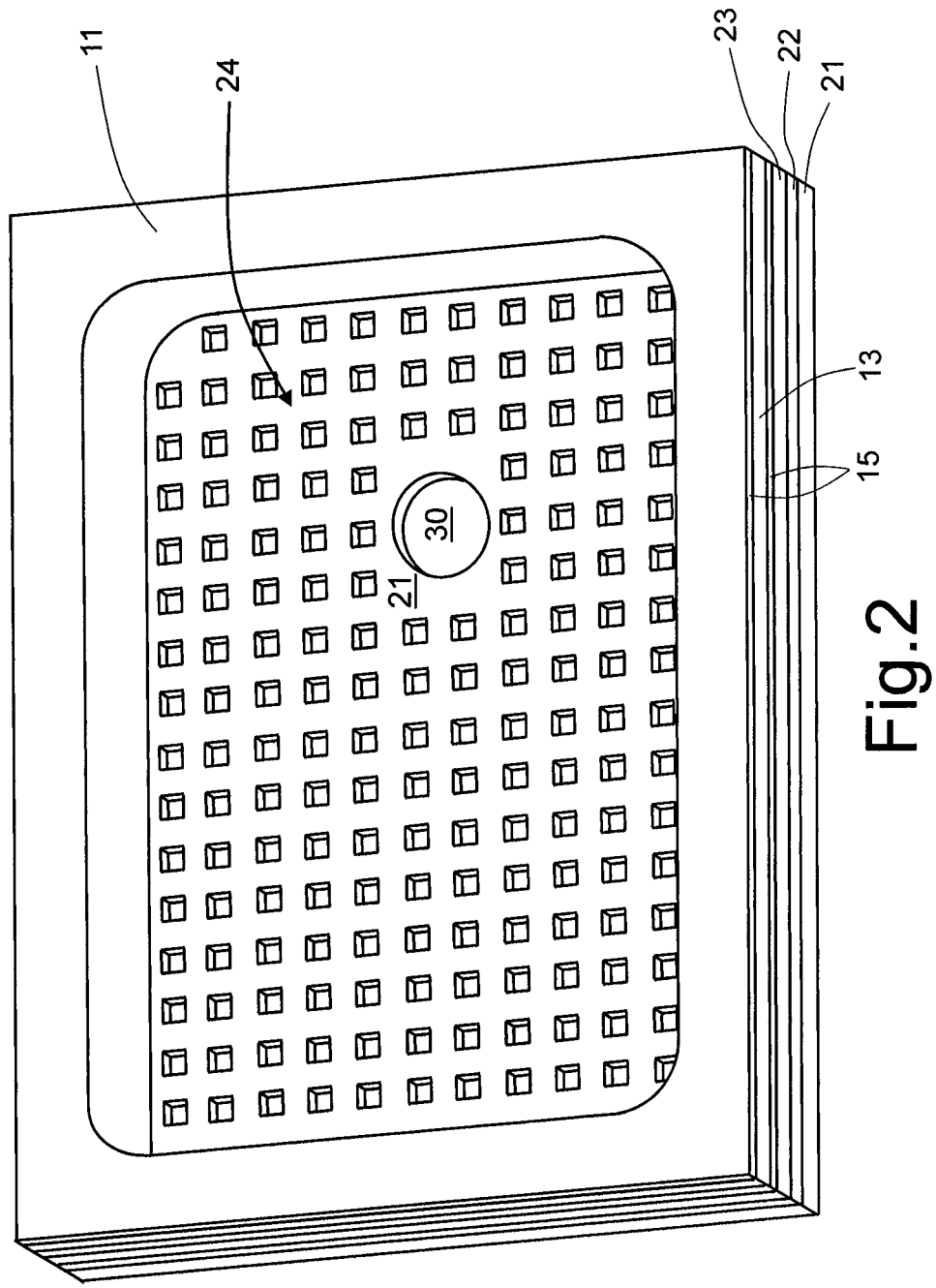
FIG. 2 is a bottom perspective view of the top part of the transducer of FIG. 1.

With reference to FIGS. 1 and 2, a MEMS transducer 1 of an acoustic type comprises a packaging 2 housing a microphone 3, manufactured in the MEMS technology, and an integrated circuit 4, typically an ASIC (application-specific integrated circuit), formed by a semiconductor material chip integrating the reading electronics for amplifying and treating the signal generated by the microphone 3. Hereinafter, the microphone 3 and the integrated circuit 4 are also referred to as chips 3, 4.

The microphone 3 comprises a structural layer 6 of semiconductor material, for example silicon, in which a cavity 7 is formed, for example through chemical etching from the back. A diaphragm 8 is formed in, or coupled to, the structural layer 6 and upwardly closes the cavity 7; the diaphragm 8 is flexible and, in use, undergoes deformation as a function of the pressure of the incident sound waves. A rigid plate 9 (generally known as "back-plate") is arranged on top of the diaphragm 8 and facing it. The back-plate 9 forms the fixed electrode of a detection capacitor with variable capacitance, the mobile electrode whereof is formed by the diaphragm 8, and has a plurality of holes (not illustrated), for enabling free circulation of air towards the diaphragm 8 (in effect causing the back-plate 9 to be acoustically transparent). The microphone 3 further comprises (in a way not illustrated) electrical contacts for biasing the diaphragm 8 and the back-plate 9 and picking up a capacitive variation signal resulting from the deformation of the diaphragm 8 caused by the incident acoustic pressure waves; in general, the electrical contacts are arranged in a surface portion of the microphone chip 3.

The package 2 is formed by three parts: a bottom substrate 10, an intermediate substrate 11, and a top substrate 12, the top substrate forming, together with the intermediate substrate 11, a cap or lid for the bottom substrate 10.

In detail, the bottom substrate 10 (having, for example, an overall thickness of 200 μm) is typically formed by one or more core layers of insulating material, typically plastic, in particular an epoxy resin, and specifically a BT (bismaleimide triazine) laminate or an FR-4 laminate or other material of printed circuits. The bottom substrate 10 comprises metal structures inside it. For example, the substrate may contain a conductive layer 25, whether continuous or mesh-shaped or grid-shaped. The bottom substrate 10 carries the microphone 3 and the integrated circuit 4; consequently, adhesive regions (not illustrated) extend between a first surface 10a of the bottom substrate 10 (facing the intermediate substrate 11) and the chips 3, 4. Furthermore, conductive structures (not illustrated), such as conductive paths and contact pads, are formed on the surface 10a of the bottom substrate 10 to enable electrical connection between the microphone 3, the integrated circuit 4, and the outside. In the example illustrated, wires 28a, 28b connect, respectively, the chips 3, 4 together and the microphone 3 with the conductive structures (not illustrated) on the first surface 10a of the bottom substrate 10 (paths, pads). Furthermore, a number of conductive vias 16 extend through the bottom substrate 10, for connecting conductive structures at the first surface 10a with conductive structures at a second surface 10b, on the back of the MEMS transducer 1 and at least one of them is grounded. Alternatively, conductive vias (not illustrated) may connect only the first surface 10a to the conductive layer 25, and at least one different conductive via connects the conductive layer 25 to the second surface 10b and to ground.

The intermediate substrate 11 is formed by an intermediate core layer 13, also of BT, FR-4 or similar insulating material, drilled throughout its thickness so as to define an internal cavity or chamber 14 housing the chips 3, 4. The intermediate core layer 13 of the intermediate substrate 11 is coated with a metal layer 15, for example of copper, which coats at least the top surface, the bottom surface, and the wall of the chamber 14. The intermediate substrate 11 is moreover bonded to the bottom substrate 10 through a first electrically conductive adhesive layer 20, for example of conductive epoxy resin, for example with a filler of a metal material such as silver (Ag). The total thickness of the intermediate substrate 11 may be comprised between 500 and 600 μm and depends upon the height of the chip forming the microphone 3 and the free space for connection of the wires 28a, 28b.

The top substrate 12 comprises a top core layer 21, which is also of FR-4, BT or similar insulating material and is coated with a shield layer 22 of conductive material, typically metal, for example copper. The thickness of the shield layer may be for example 17 μm, and the total thickness of the top substrate 12 may be for example 60-100 μm. The shield layer 22 forms, over the chamber 14, a mesh or grid 24, as may be seen in particular in FIG. 2. By the term "mesh or grid 24" is understood a non-continuous structure formed by portions or stretches completely connected together so that all the points of the mesh or grid are electrically connected together and at the same potential.

In FIG. 2, for example, the mesh or grid 24 has a series of holes 26, here square-shaped with sizes 100 μm×100 μm, arranged in an array, aligned in rows and columns and at a distance apart of for example 100 μm.

The shield layer 22 is bonded to the intermediate substrate 11 through a second adhesive layer 23, for example of conductive epoxy resin, like the first adhesive layer 20. Furthermore, the mesh or grid 24 is coated with an insulating layer 27, for example a solder mask of polymeric material, such as resist, having a thickness of 20 μm.

In this way, the mesh or grid 24, together with the second adhesive layer 23, the metal layer 15, the first adhesive layer 20, and the conductive layer 25, forms a Faraday cage 29, connected to ground through one or more vias 16, which electrostatically shields the chips 3, 4, and uses a smaller amount of material than a continuous layer.

The top substrate 12 moreover has a hole 30 extending through the top core layer 21, the mesh or grid 24, and the insulating layer 27 so as to put the chamber 14 in communication with the outside and enable entrance of the sound waves to be detected by the microphone 3.

The MEMS transducer 1 is manufactured as described with reference to FIGS. 3-10.

FIGS. 3-5 show the steps for manufacturing the intermediate substrate 11. Initially (FIG. 3), a intermediate core wafer 13' of insulating material is coated with a top metal layer 35a and a bottom metal layer 35b of metal material, for example copper, with a thickness of, for example, 25 μm. The coating may be obtained via lamination of a copper layer on the intermediate core wafer 13' or by sputtering and subsequent electrolytic or electroless plating. Then (FIG. 4), the intermediate core wafer 13' is drilled using a purposely provided drilling tool, such as a microdrill, in a per se known manner, so as to form a plurality of chambers 14.

Next (FIG. 5), the exposed portions of the intermediate core wafer 13' (on the sides of the chambers 14) are coated via plating with metal material, for example copper, forming, together with the top and bottom metal layers 35a, 35b, the metal layer 15. Alternatively, the lateral portions of the metal layer 15 (on the sides of the chambers 14) may be obtained by sputtering.

During, before, or after machining of the intermediate substrate 11, the top substrate 12 is manufactured, as illustrated in FIGS. 6-9. In detail (FIG. 6), a top core wafer 21' of insulating material (for example, FR-4, BT or the like) is coated on just one side with a shield layer 22', for example of laminated copper. Then (FIG. 7), using a resist mask (not illustrated) the portions of the shield layer 22' that are to form the mesh or grid portions 24 (on top of the chambers 14) are selectively etched, and resist is removed. Optionally, to facilitate the subsequent bonding between the intermediate substrate 11 and the bottom substrate 10, plating may be carried out to form an auxiliary metal layer 35, for example of Au or Ni, illustrated dashed only in FIG. 7.

Next (FIG. 8), an insulating layer is deposited, for example of polymeric material, such as resist (solder mask) with a thickness of 20 μm, and is defined, so as to form the insulating layer 27 on the mesh or grid portions 24, and to be removed from the portions of the shield layer 22' that are to be bonded to the intermediate core wafer 13'.

Then (FIG. 9), the top core wafer 21' is drilled so as to form a plurality of holes 30, one for each mesh or grid 24, and (FIG. 10) is bonded to the intermediate core wafer 13', through a second adhesive layer 23'. The structure of FIG. 10 thus obtained forms a cap wafer 36.

Figure 11:
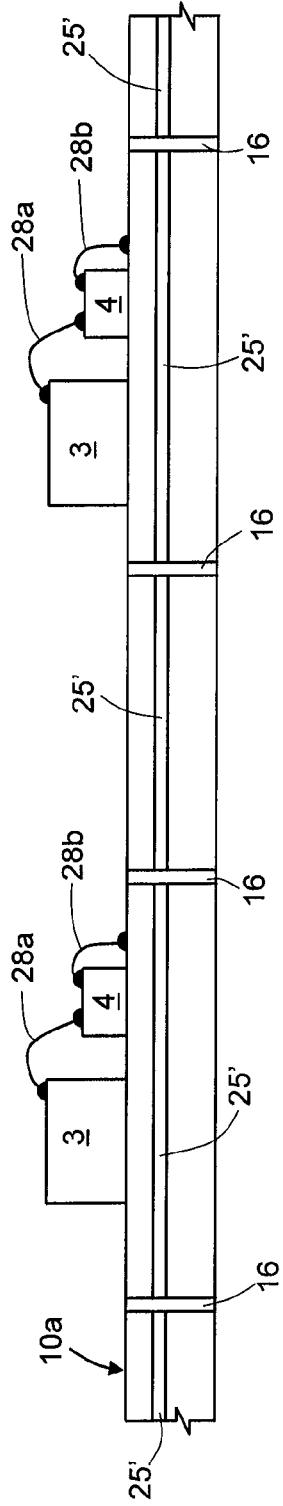

In the meantime (FIG. 11), a substrate wafer 10' is provided, formed by one or more core layers and one or more conductive layers 25' (in FIG. 11, just one); the substrate wafer 10' is drilled, and the holes are metallized to form the vias 16, using the techniques known in the production of printed circuits. In this step, furthermore, conductive paths and contact regions are formed on the surfaces 10a and 10b of the substrate wafer 10'. Then, the chips 3, 4 are bonded on the substrate wafer 10', and the wires 28a, 28b are provided.

Next (FIG. 12), the cap wafer 36 is flipped over and fixed to the substrate wafer 10' through a first adhesive layer 20'.

Figure 12:
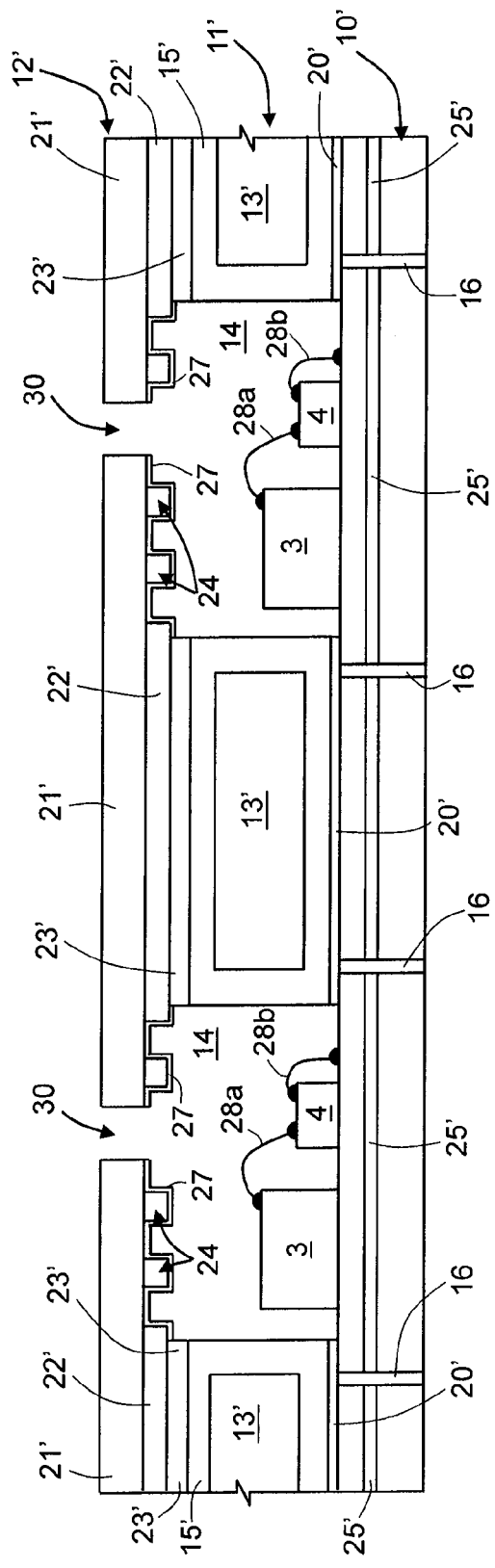

Finally, the composite wafer of FIG. 12 is diced to obtain a plurality of MEMS devices 1 of FIG. 1.

Figure 13:
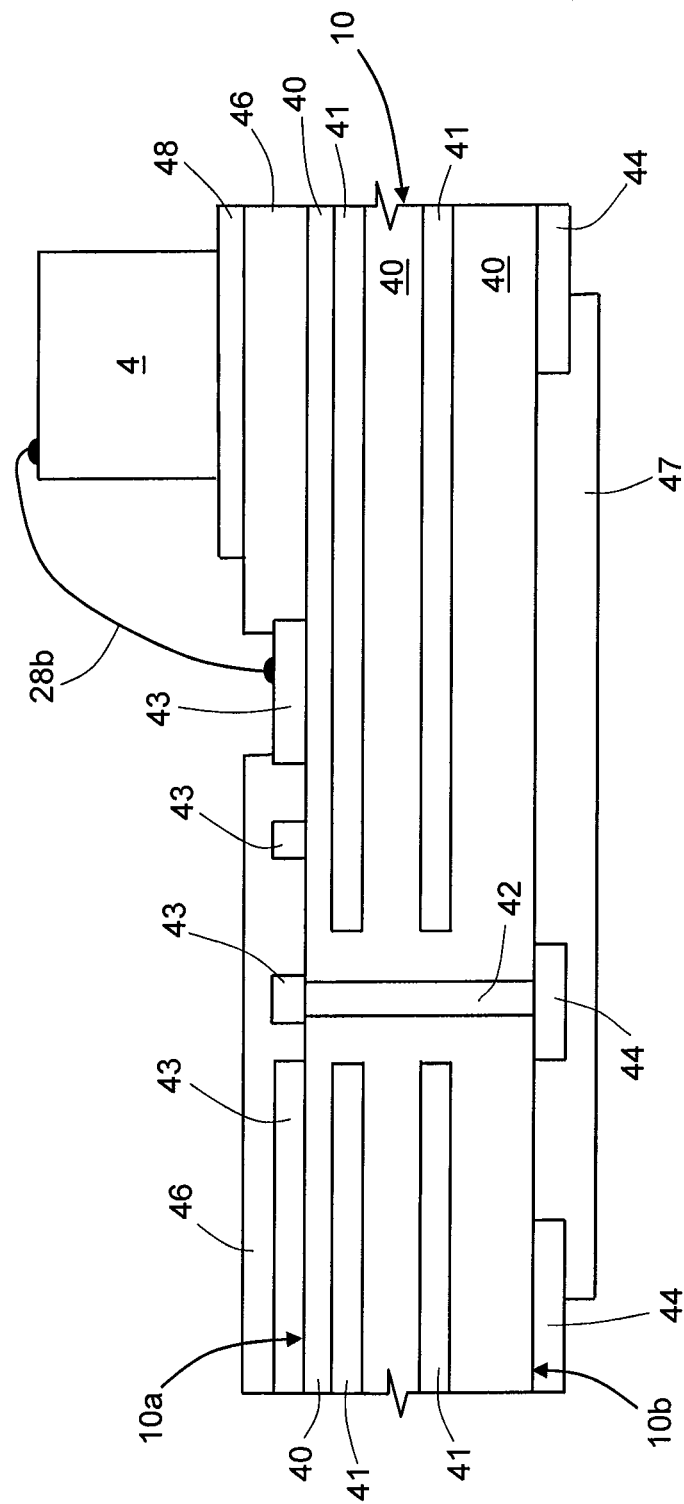
FIG. 13 shows an enlarged cross-section of a variant of a detail of the transducer of FIG. 1.

FIG. 13 shows a variant of a detail of the MEMS transducer 1 of FIG. 1. Here, the bottom substrate 10 is of the multilayer type, including a plurality of core layers 40 of insulating material, e.g., BT or FR-4, arranged on each other, with conductive layers 41 extending between them. The conductive layers 41 may be interrupted in overlying points so as to enable formation of vias 42; in the example illustrated, a via 42 extends throughout the thickness of the bottom substrate 10 and connects one of the top conductive regions 43 formed on the first surface 10a to one of the bottom conductive regions 44 formed on the second surface 10b of the bottom substrate 10. The layers 41 are connected together through vias (not illustrated) and some of the conductive regions 43 and 44 (insulated from the conductive regions 43 and 44 connected to the chips 3, 4) to create the ground connection of the Faraday cage 29.

A top insulation layer 46, for example a solder-mask layer, coats the first surface 10a, and a bottom insulation layer 47, for example also a solder-mask layer, coats the second surface 10b, with the exception of the conductive regions and 43, 44 that are to be connected to wires 28a, 28b or where other contact structures (not illustrated), for example flip-chip solder bumps, for electrical connection to printed circuits, are to be provided, in a per se known manner.

In the detail illustrated in FIG. 13, the integrated circuit 4 is bonded, via an adhesive layer 48, on the top insulation layer 46.

The conductive layers 41 may be of a continuous type (except for at the vias 42) or may have a mesh configuration, such as the mesh or grid 24 of FIG. 1 or 2 or as discussed hereinafter with reference to FIGS. 17, 18.

Figure 14:
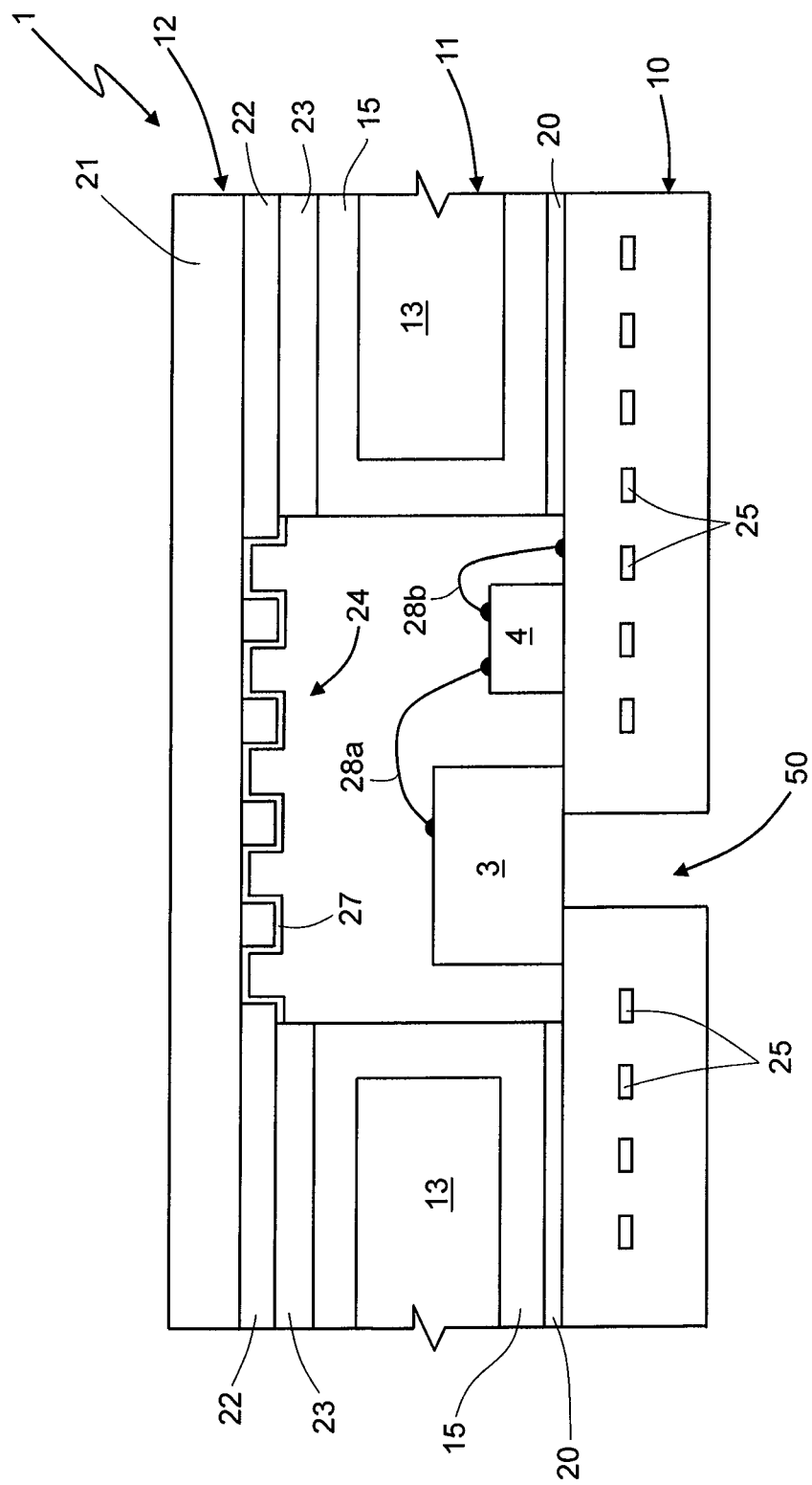
FIG. 14 shows a cross-section of a different embodiment of the present encapsulated electronic transducer.

FIG. 14 shows an embodiment where a hole 50 is formed in the bottom substrate 10 under the microphone 3 so as to enable the waves acoustic to reach the microphone 3 and be detected thereby.

Figure 15:
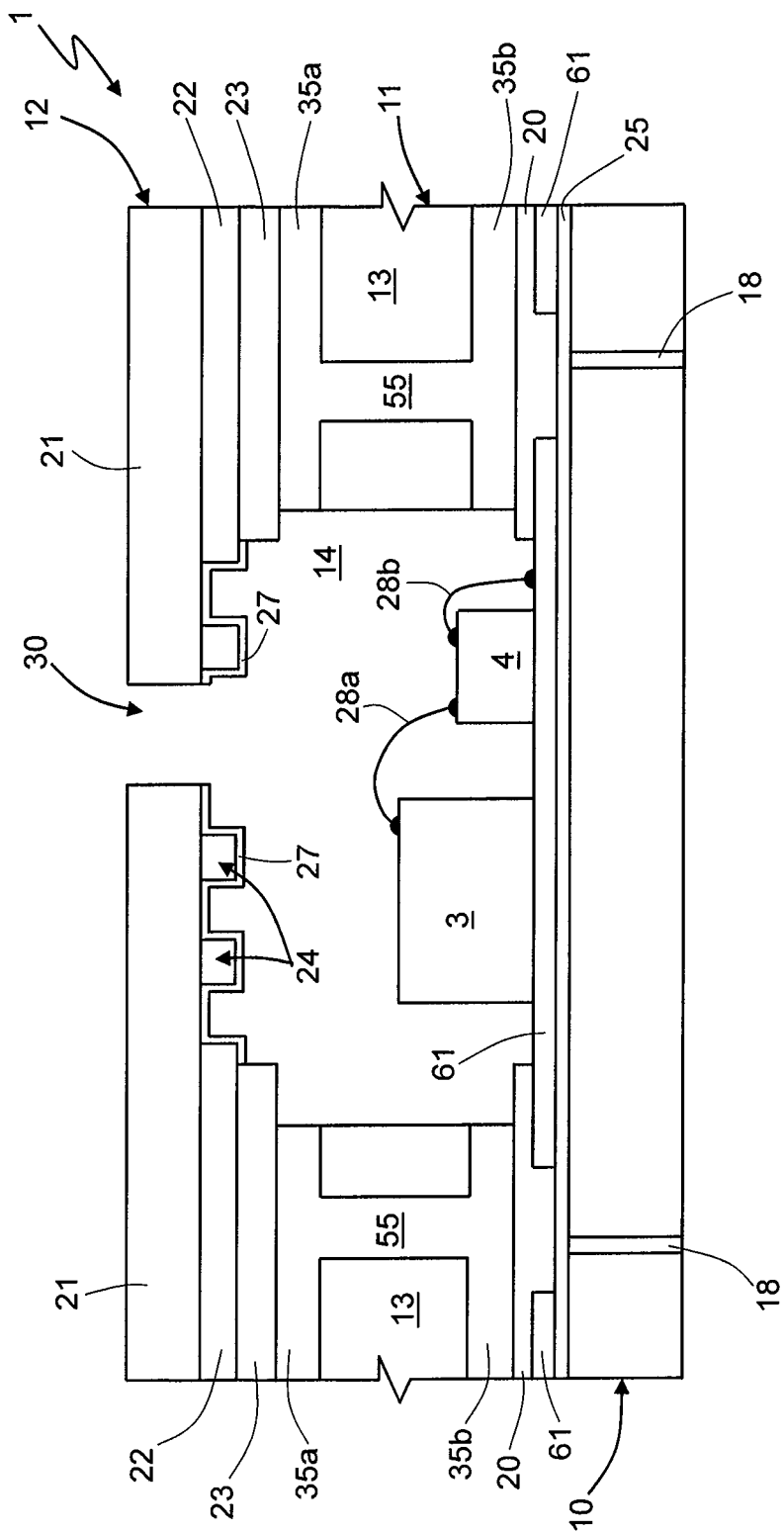
FIG. 15 shows a cross-section of another embodiment of the present transducer.

In FIG. 15, the intermediate substrate 11 has vias 55 of conductive material that connect the top metal layer 35a to the bottom metal layer 35b. Here, the side walls of the chamber 14 are not coated with metal material, and the vias 55 contribute to forming a Faraday cage with the mesh or grid 24 and the conductive layer 25. The vias 55 may be obtained by drilling the intermediate substrate 11 during drilling of the chambers 14 or in a separate step to form openings that surround the chambers 14 and then filling the openings thus obtained with metal material. The vias 55 here do not form a continuous wall, as in the embodiment of FIGS. 1-12, but are effective in forming a Faraday cage. Alternatively, only the walls of the vias 55 may be metallized, leaving the inside empty or filling it with even non-conductive material, such as resin, which is of lower cost. According to yet another alternative, if the vias 55 are formed prior to formation of the chamber 14 and during drilling of the chamber, the wall of the latter traverses one or more vias 55, half of which are removed, leaving half of the via or vias 55 facing the inside of the chamber 14 (in this case, the cross-section through the package 2 is similar to that of FIG. 1).

Furthermore, in the example illustrated, the electrical connection between the first adhesive layer 20 and the conductive layer 25 in the bottom substrate 10 is direct. For example, by forming the top layer (designated by 61 in FIG. 15) of the bottom substrate 10 with solder mask or other non-conductive material that may be shaped via chemical etching, the top layer 61 may be selectively removed in some points, so that when the first adhesive layer 20 is laid, this directly contacts the conductive layer 25 in the removed points of the top layer 61. In this case, vias 18 connect the conductive layer 25 with the second surface 10b of the bottom substrate to enable connection to ground.

In FIG. 15, the hole 30 is formed in the top substrate 12, but could be formed in the bottom substrate 10, as in FIG. 14.

Figure 16:
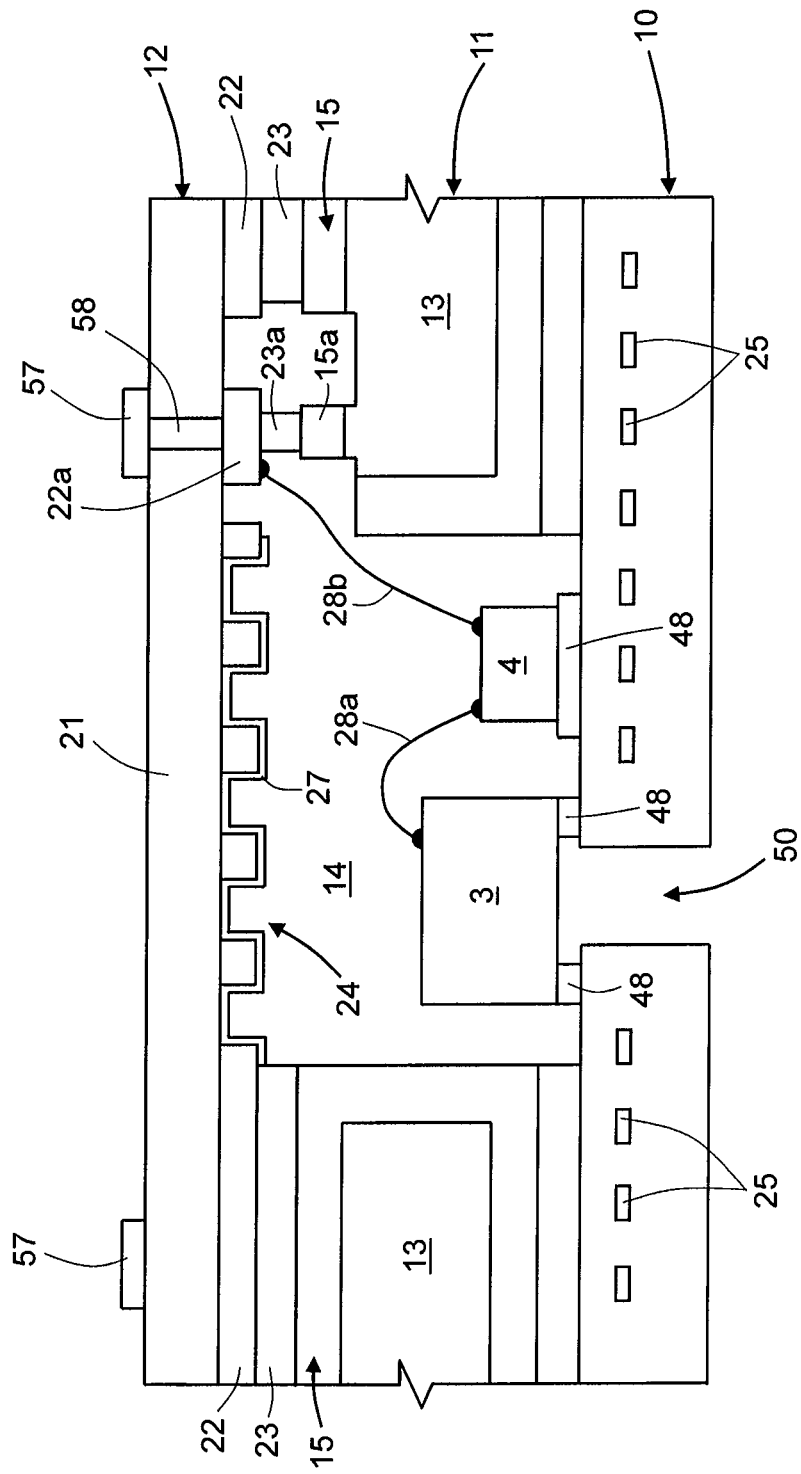
FIG. 16 shows a cross-section of a different embodiment of the present transducer.

FIG. 16 shows a MEMS transducer 1, where the connection of the chips 3, 4 with the outside is made through the top substrate 12, as described in detail in patent application No. TO2009A0001036, filed on Dec. 23, 2009. In detail, here the top core layer 21 has vias 58 that connect together its main faces and are aligned vertically and to conductive regions 57 (paths and/or contact pads) on one side and to conductive portions 22a of the shield layer 22. The wire 28b electrically connects the integrated circuit 4 with a conductive portion 22a of the shield layer 22. To electrically insulate the conductive portion 22a from the second adhesive layer 23 and from the metal layer 15, the top metal layer 35a and the second adhesive layer 23 are defined before being bonded together so as to form portions 15a electrically insulated from the rest of the metal layer 15 and adhesive portions 23a electrically insulated from the rest of the second adhesive layer 23.

In practice, before forming the shield layer 22', the top core layer 21 is drilled, and the holes thus obtained are filled with conductive material (for example copper) to form the vias 57. Also in this case, it is possible to coat only the walls of the holes or of the vias, thus obtaining empty cylindrical connections or connections filled with non-conductive material such as resin. The conductive regions 57 on the main face of the top core layer 21 are formed of metal such as Cu, Ni, Au, and the conductive portions 22a are formed while defining the shield layer 22' to obtain the grid or mesh regions 24. Likewise, during definition of the top metal layer 35a and of the second adhesive layer 23', the adhesive portions 23a and the portions 15a of the top metal layer 35a are formed.

Figure 17:
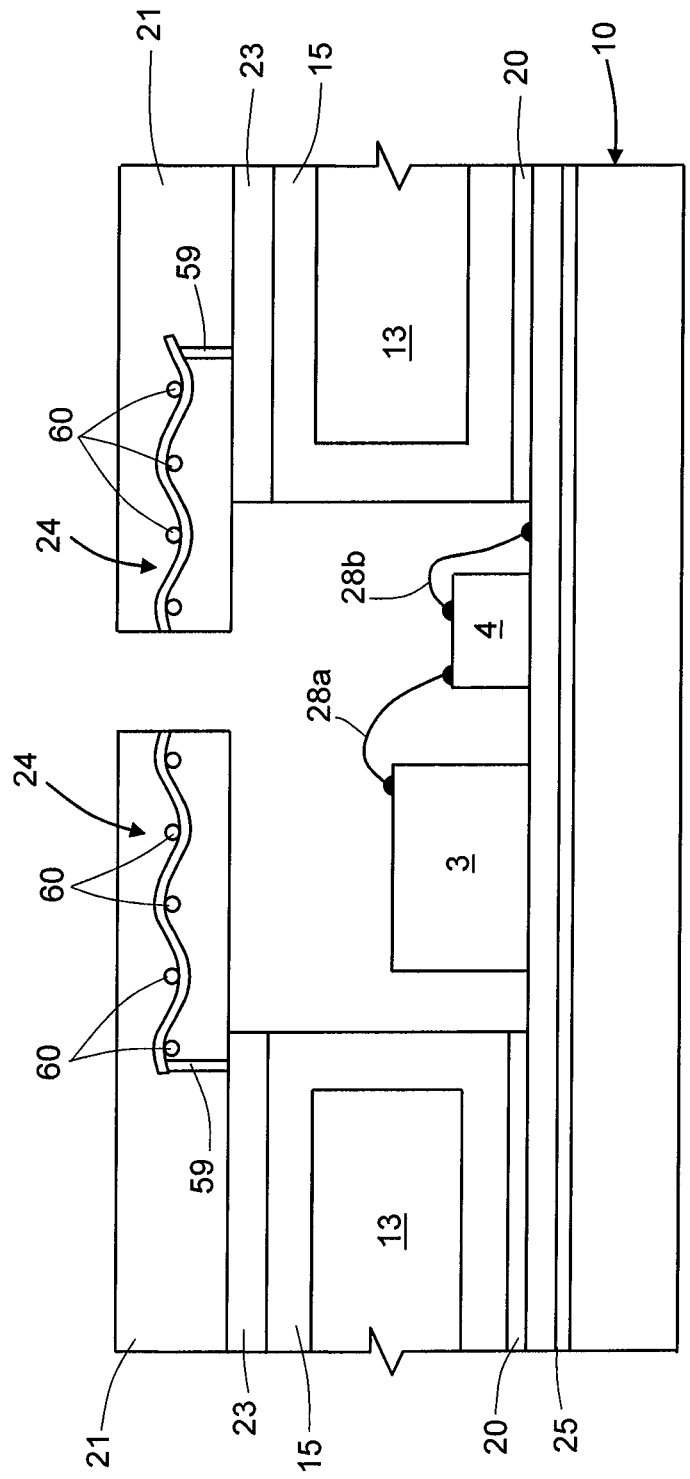
FIG. 17 shows a cross-section of another embodiment of the present transducer.
Figure 18:
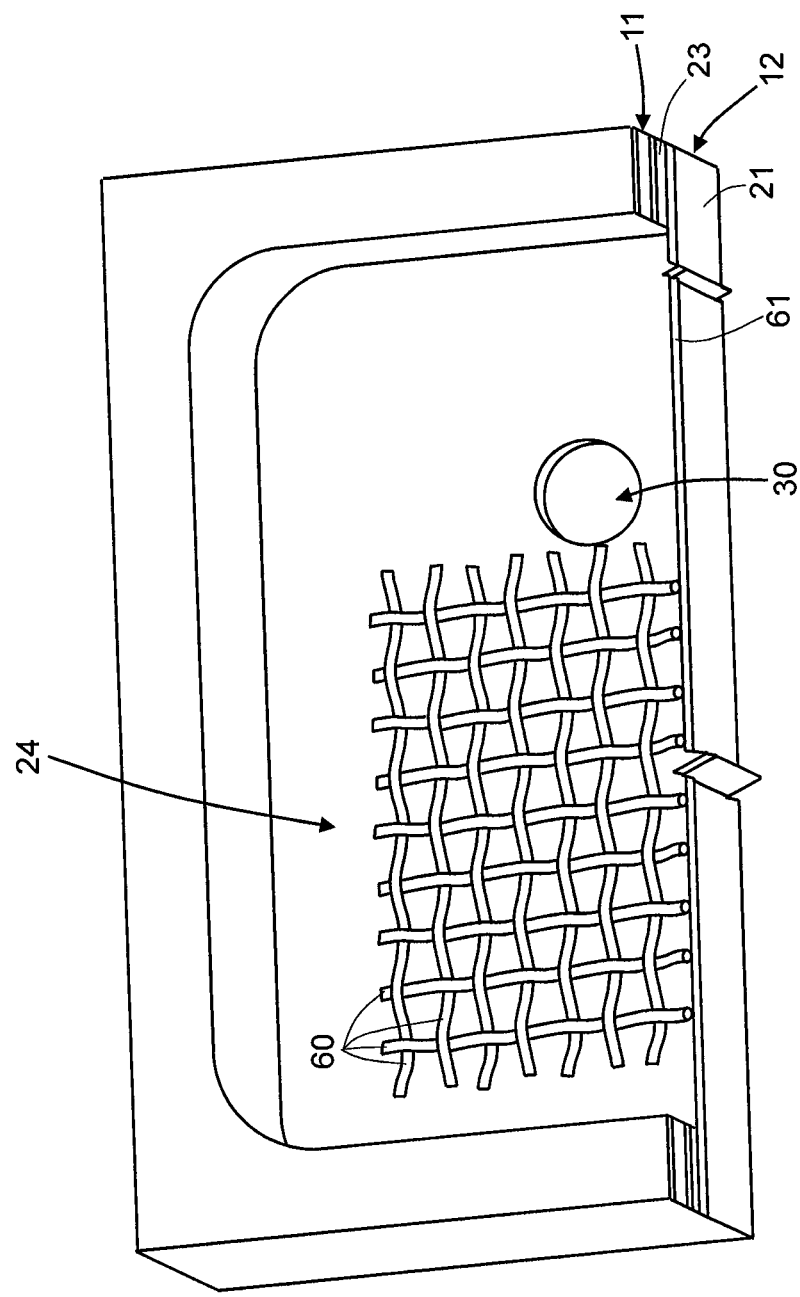
FIG. 18 shows a partially sectioned bottom perspective view of a variant of the present transducer.

FIG. 17 shows an embodiment where the mesh or grid 24 is provided via interwoven wires 60 embedded in the material of the top core layer 21. In this case, the mesh or grid 24 is formed preliminarily and then inserted in the top core layer 21 during a co-moulding step. Vias 59 connect the mesh or grid 24 to the second adhesive layer 23.

According to another embodiment, the mesh or grid 24 is formed by interwoven wires 60 and is fixed to the top core layer 21, for example using a third adhesive layer 61. In this case, the mesh or grid 24 extends laterally with respect to the hole 30 and thus does not cover the integrated circuit 4. Alternatively, a hole may be made in the bottom substrate 10, as illustrated in FIG. 14, and in this case the mesh or grid 24 may coat both of the chips 3, 4. In a way not illustrated, the mesh or grid 24 may extend as far as the intermediate substrate 11 so as to contact the second adhesive layer 23, or else conductive paths may be provided for connecting the mesh or grid 24 electrically to the second adhesive layer 23.

The MEMS transducer 1 described herein has numerous advantages.

In particular, the mesh or grid 24 enables reduction of the amount of metal material used to obtain the shielding, though operating effectively according to the principle of a Faraday cage. In fact, even when the mesh or grid 24 is formed by etching a deposited or grown layer, the removed material may be recovered and re-used. The saving obtained by the lower metal consumption is only in part compensated for by the production steps necessary for forming or bonding the mesh or grid 24. It follows that the finished MEMS transducer has lower costs.

Furthermore, the insulating layer 27 prevents the mesh or grid 24 from being shorted with the wires 28a, 28b, and/or other conductive structures within the chamber 14 because of the inevitable mechanical deformation of the structure, in particular of the top substrate 12, and of the small spaces.

Figure 19:
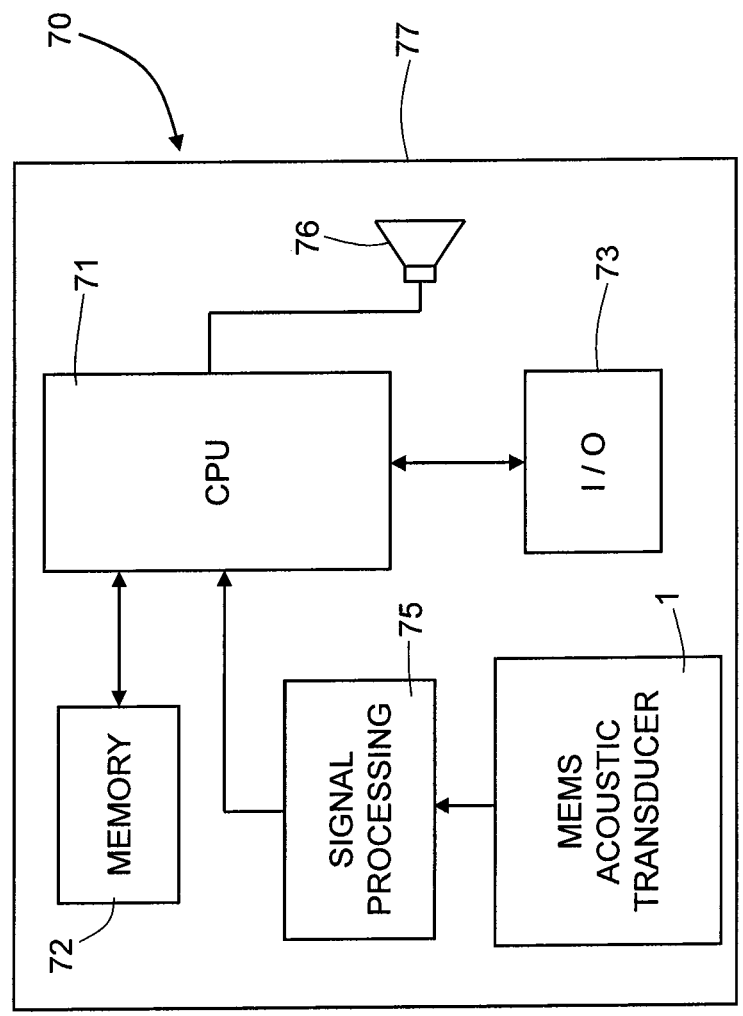
FIG. 19 shows a general block diagram of an apparatus incorporating the present transducer.

The characteristics listed previously render particularly advantageous the use of the MEMS acoustic transducer 1 in an electronic apparatus 70, as illustrated in FIG. 19. The electronic apparatus 70 is preferably a mobile communications device, such as for example a cell phone, a PDA, a notebook, but also a voice recorder, an audio-file reader with voice-recording capacity, etc. Alternatively, the electronic apparatus 70 may be a hydrophone, which is able to work under water, or else a hearing-aid device.

The electronic apparatus 70 comprises a microprocessor (CPU—central processing unit) 71, a memory block 72, connected to the microprocessor 71, and an input/output interface 73, for example equipped with a keyboard and a display, which is also connected to the microprocessor 71. The transducer 1 communicates with the microprocessor 71. In particular, the ASIC 4 sends the electrical output signals to the microprocessor 71 (a further electronic circuit may also be provided for processing the electrical output signals, designated by 75). Furthermore, a loudspeaker 76 is present for generation of sounds on an audio output (not illustrated) of the electronic apparatus 70. As illustrated schematically, the transducer 1, the microprocessor 71, the memory block 72, the input/output interface 73, and the possible further electronic components are coupled to a single printed circuit board 77, for example with the SMD (surface-mount device) technique.

Finally, it is clear that modifications and variations may be made to the MEMS transducer and to the manufacturing method described and illustrated herein, without thereby departing from the scope of the present disclosure.

For example, in the embodiment of FIG. 13, instead of just one via 42 extending through the entire thickness of the bottom substrate 10, it is possible to use two or more partial vias, which connect a respective face of the bottom substrate 10 to a conductive region 25 and/or to conductive regions 25, 40 together, in a per se known manner in the sector of printed-circuit boards.

The contact between the conductive layer 25 (and possibly the conductive layers 41) may be obtained in any one of the ways described for all the illustrated embodiments. Consequently, irrespective of the number of conductive layers 25, 41, the position of the hole 30 or 50, the presence or not of vias 33 in the intermediate substrate 11 or of the layer 15 coating the walls of the chamber 15, and the configuration of the mesh or grid 24, it is possible to provide vias 16 or 42 or 18 and/or contact directly the conductive layer 25 with the first adhesive layer 20.

Furthermore, in the case where the MEMS chip 3 incorporates the read circuits, the MEMS transducer 1 could house just the chip 3, and this would be connected directly via the wires 28a with the outside, through the first substrate 10 or the third substrate 12, without the need to provide a separate ASIC 4.

The various embodiments described above can be combined to provide further embodiments. All of the U.S. patents, U.S. patent application publications, U.S. patent application, foreign patents, foreign patent application and non-patent publications referred to in this specification are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing a micro-electro-mechanic device, comprising:
   bonding a MEMS chip onto a first substrate incorporating an electrically conducting region;
   forming a chamber in a second substrate;
   forming a conductive connection structure transversely to the second substrate;
   forming a grid or mesh structure of electrically conductive material on a third substrate;
   bonding the third substrate to the second substrate so that the grid or mesh structure extends on the chamber; and
   bonding the second substrate to the first substrate so that the chamber surrounds the MEMS chip, the chamber is enclosed between the third and the first substrates, and the electrically conducting region is electrically coupled to the conductive connection structure and to the grid or mesh structure, forming a Faraday cage.

2. A process according to claim 1, wherein forming the grid or mesh structure comprises forming a metal layer on a surface of a core layer of the third substrate and removing selective portions of the metal layer.

3. A process according to claim 2, further comprising coating the grid or mesh structure with an insulating layer.

4. A process according to claim 1, wherein forming the grid or mesh structure comprises forming a mesh of metal wires mutually interwoven and bonding the mesh of metal wires to the third substrate or incorporating the mesh of metal wires in the third substrate.

5. A process according to claim 1, further comprising forming an external communication hole opening onto the chamber in the first or in the third substrate before bonding the second substrate to the first substrate or before bonding the third substrate to the second substrate.

6. A process according to claim 1, wherein forming the chamber and forming the conductive connection structure comprise coating first and second faces of an intermediate core layer with metal material; drilling the intermediate core layer to form the chamber and coating lateral walls of the chamber with further metal material.

7. A process according to claim 1, wherein forming the conductive connection structure comprises forming conductive vias by forming apertures in an intermediate core layer, the apertures surrounding the chamber, and filling the apertures with metal material.

8. A process according to claim 1, wherein bonding the third substrate to the second substrate comprises bonding the first face of the second substrate to the third substrate through the conductive connection structure and a conductive adhesive layer.

9. An encapsulated micro-electro-mechanical device, comprising:
a MEMS chip; and
a package having first, second, and third substrates bonded to each other, the first substrate having an electrically conductive region and a main surface carrying the MEMS chip; the second substrate being bonded to the first substrate, defining a chamber surrounding the MEMS chip, and having a conductive connection structure extending transversely between the first and the third substrates; and the third substrate being bonded to the second substrate, upwardly defining the chamber, and having a grid or mesh structure of electrically conductive material overlying the MEMS chip; the electrically conductive region, the conductive connection structure, and the grid or mesh structure being electrically coupled to each other and forming a Faraday cage.

10. A device according to claim 1, wherein the first, the second and the third substrates comprise respective first, second, and third core layers of insulating material, wherein the first core layer accommodates the electrically conductive region; the conductive connection structure is supported by the second core layer; and the grid or mesh structure is embedded in, or extends on, the third core layer.

11. A device according to claim 10, wherein the conductive connection structure coats a wall of the second core layer and delimits the chamber or forms conductive vias extending through the second core layer.

12. A device according to claim 10, wherein the grid or mesh structure extends on the chamber and includes a shield layer of conductive material extending on a first face of the third core layer facing the first and the second substrates.

13. A device according to claim 12, further comprising an insulating layer that coats the grid or mesh structure.

14. A device according to claim 12, wherein the grid or mesh structure includes a mesh of metal wires mutually interwoven, the mesh of metal wires being embedded in the third core layer or bonded on the first face of the third core layer facing the first and the second substrates.

15. A device according to claim 12, further comprising:
a first conductive portion extending on the first face of the third core layer and insulated from the shield layer;
a second conductive portion electrically coupled to the first conductive portion, sandwiched between the second and the third substrates, and insulated from the conductive connection structure;
a through via extending through the third core layer and in electric contact with the first conductive portion;
a third conductive portion extending on a second face of the third core layer not facing the second substrate; and
a wire coupling the MEMS chip to the first conductive portion.

16. A device according to claim 1, wherein the electrically conductive region in the first substrate is shaped as a mesh or grid.

17. A device according to claim 1, wherein the first substrate comprises a plurality of core layers of insulating material and a plurality of electrically conductive regions, the plurality of core layers being interleaved with the plurality of electrically conductive regions.

18. A device according to claim 1, wherein the MEMS chip includes an integrated microphone, the device further comprising an ASIC integrated circuit carried by the first substrate and electrically coupled to the MEMS chip.

19. An apparatus, comprising:
a processor; and
an encapsulated micro-electro-mechanical device that includes:
a MEMS chip; and
a package having first, second, and third substrates bonded to each other, the first substrate having an electrically conductive region and a main surface carrying the MEMS chip; the second substrate being bonded to the first substrate, defining a chamber surrounding the MEMS chip, and having a conductive connection structure extending transversely between the first and the third substrates; and the third substrate being bonded to the second substrate, upwardly defining the chamber, and having a grid or mesh structure of electrically conductive material overlying the MEMS chip; the electrically conductive region, the conductive connection structure, and the grid or mesh structure being electrically coupled to each other and forming a Faraday cage.

20. An apparatus according to claim 19, wherein the first, the second and the third substrates comprise respective first, second, and third core layers of insulating material, wherein the first core layer accommodates the electrically conductive region; the conductive connection structure is supported by the second core layer; and the grid or mesh structure is embedded in, or extends on, the third core layer.

21. An apparatus according to claim 20, wherein the conductive connection structure coats a wall of the second core layer and delimits the chamber.

22. An apparatus according to claim 20, wherein the grid or mesh structure extends on the chamber and includes a shield layer of conductive material extending on a first face of the third core layer facing the first and the second substrates, the device including an insulating layer that coats the grid or mesh structure.

23. An apparatus according to claim 20, wherein the device includes:
a first conductive portion extending on a first face of the third core layer and insulated from the shield layer;
a second conductive portion electrically coupled to the first conductive portion, sandwiched between the second and the third substrates, and insulated from the conductive connection structure;
a through via extending through the third core layer and in electric contact with the first conductive portion;
a third conductive portion extending on a second face of the third core layer not facing the second substrate; and
a wire coupling the MEMS chip to the first conductive portion.

24. An apparatus according to claim 19, wherein the grid or mesh structure includes a mesh of metal wires mutually interwoven.

25. An apparatus according to claim 19, wherein the first substrate comprises a plurality of core layers of insulating material and a plurality of electrically conductive regions, the plurality of core layers being interleaved with the plurality of electrically conductive regions.

26. An apparatus according to claim 19, wherein the MEMS chip includes an integrated microphone, the device further comprising an ASIC integrated circuit carried by the first substrate and electrically coupled to the MEMS chip.

* * * * *

UNITED STATES PATENT AND TRADEMARK OFFICE
CERTIFICATE OF CORRECTION

PATENT NO.       : 8,551,799 B2                                    Page 1 of 1
APPLICATION NO.  : 13/102831
DATED            : October 8, 2013
INVENTOR(S)      : Mark Andrew Shaw et al.

It is certified that error appears in the above-identified patent and that said Letters Patent is hereby corrected as shown below:

In the Claims

Column 9, Line 26:
"10. A device according to claim 1, wherein the first, the" should read, --10. A device according to claim 9, wherein the first, the--.

Column 9, Line 61:
"16. A device according to claim 1, wherein the electrically" should read, --16. A device according to claim 9, wherein the electrically--.

Column 9, Line 64:
"17. A device according to claim 1, wherein the first" should read, --17. A device according to claim 9, wherein the first--.

Column 10, Line 3:
"18. A device according to claim 1, wherein the MEMS chip" should read, --18. A device according to claim 9, wherein the MEMS chip--.

Signed and Sealed this
Eighth Day of April, 2014

Michelle K. Lee
*Deputy Director of the United States Patent and Trademark Office*